US010200040B2

United States Patent
Crotty et al.

(10) Patent No.: US 10,200,040 B2
(45) Date of Patent: *Feb. 5, 2019

(54) PRECISION MODULATION TIMER (PMT) INTEGRATED IN A PROGRAMMABLE LOGIC DEVICE

(71) Applicant: AnDAPT, Inc., San Jose, CA (US)

(72) Inventors: Patrick J. Crotty, San Jose, CA (US); Kapil Shankar, Saratoga, CA (US); John Birkner, Woodside, CA (US)

(73) Assignee: AnDAPT, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/951,029

(22) Filed: Apr. 11, 2018

(65) Prior Publication Data

US 2018/0234097 A1 Aug. 16, 2018

Related U.S. Application Data

(63) Continuation of application No. 15/656,978, filed on Jul. 21, 2017, now Pat. No. 9,979,395.

(60) Provisional application No. 62/365,325, filed on Jul. 21, 2016.

(51) Int. Cl.
| H03K 19/173 | (2006.01) |
| H03K 19/177 | (2006.01) |
| H03K 19/0175 | (2006.01) |
| H03K 5/131 | (2014.01) |
| H03K 5/135 | (2006.01) |
| H03K 5/00 | (2006.01) |
| H03K 19/00 | (2006.01) |

(52) U.S. Cl.
CPC ..... *H03K 19/017581* (2013.01); *H03K 5/131* (2013.01); *H03K 5/135* (2013.01); *H03K 19/017509* (2013.01); *H03K 19/0016* (2013.01); *H03K 2005/00078* (2013.01); *H03K 2005/00247* (2013.01)

(58) Field of Classification Search
CPC ........... H03K 19/017581; H03K 5/131; H03K 5/135; H03K 19/017509; H03K 19/0016; H03K 2005/00078
USPC ......................................................... 326/39
See application file for complete search history.

(56) References Cited

U.S. PATENT DOCUMENTS

| 5,955,905 A | 9/1999 | Idei et al. |
| 7,071,751 B1 * | 7/2006 | Kaviani ............... H03K 3/0322 327/263 |

(Continued)

*Primary Examiner* — Daniel D Chang
(74) *Attorney, Agent, or Firm* — Innovation Counsel LLP

(57) ABSTRACT

A timer block includes: a digital control block including a mode selector and a register loading a time delay; a counter coupled to the register of the digital control block, wherein the counter loads a counter value corresponding to the time delay based on an operational mode selected by the mode selector and generates a digital output indicating the counter value that is decremented at each clock; and a pulse generator configured to generate a pulse signal based on the counter value of the counter. The timer block is integrated in a programmable logic device (PLD) including a programmable fabric and a signal wrapper that is configured to provide signals between the timer block and the programmable fabric. The operational mode of the timer block is programmably configured using the programmable fabric and the signal wrapper.

20 Claims, 11 Drawing Sheets

(56) References Cited

U.S. PATENT DOCUMENTS 7,454,658 B1 11/2008 Baxter
2008/0111653 A1* 5/2008 Lee .................. H03K 5/131
                                                333/24 R

* cited by examiner

PRECISION MODULATION TIMER (PMT) INTEGRATED IN A PROGRAMMABLE LOGIC DEVICE

CROSS-REFERENCE TO RELATED APPLICATION(S)

This application is a continuation of U.S. patent application Ser. No. 15/656,978 filed Jul. 21, 2017, which claims the benefits of and priority to U.S. Provisional Patent Application Ser. No. 62/365,325 filed Jul. 21, 2016, the disclosures of which are incorporated herein by reference in their entirety.

TECHNICAL FIELD

The present disclosure relates generally to programmable logic devices (PLDs), more particularly, to a precision modulation timer integrated in a PLD.

BACKGROUND

Programmable logic devices (PLDs) such as programmable logic array (PLA) devices, programmable array logic (PAL) devices, and field-programmable gate arrays (FPGAs) have been in the market place for a long time. These PLDs can be programmed by users for a wide variety of applications and industries. Functional blocks have been integrated to expand the capabilities of the PLDs. These functional blocks can be digital and/or analog that are designed to perform specific functions to complement or supplement the programmable components of the PLDs.

PLDs can have internal elements or fabrics that are programmable and connected together to perform a specific function. More complex devices can add functional blocks to the programming fabrics. These functional blocks can be a combination of digital and analog circuitry, such as a serial interface, a voltage reference, a comparator, an analog-to-digital (A/D) converter, etc. Some devices can be optimized for speed, power, flexibility, complexity, and/or cost. These devices can interface with the external world via input/output (I/O) pins. These I/O pins can typically function up to 5V and sourcing/sinking current up to 50 mA.

Some power applications such as a power regulator and a power converter may require a higher voltage and/or a higher current that the devices and their I/O pins can handle. Users can add an external discrete high-voltage power MOSFET to an existing PLD to expand its application to high-voltage/current power applications. The discrete high-voltage power MOSFET requires another package, adding more cost and requiring more board space.

SUMMARY

A timer block includes: a digital control block including a mode selector and a register loading a time delay; a counter coupled to the register of the digital control block, wherein the counter loads a counter value corresponding to the time delay based on an operational mode selected by the mode selector and generates a digital output indicating the counter value that is decremented at each clock; and a pulse generator configured to generate a pulse signal based on the counter value of the counter. The timer block is integrated in a programmable logic device (PLD) including a programmable fabric and a signal wrapper that is configured to provide signals between the timer block and the programmable fabric. The operational mode of the timer block is programmably configured using the programmable fabric and the signal wrapper.

According to another embodiment, a programmable logic device (PLD) includes: a timer block; a programmable fabric; and a signal wrapper configured to provide signals between the timer block and the programmable fabric. The timer block includes: a digital control block including a mode selector and a register loading a time delay; a counter coupled to the register of the digital control block, wherein the counter loads a counter value corresponding to the time delay based on an operational mode selected by the mode selector and generates a digital output indicating the counter value that is decremented at each clock; and a pulse generator configured to generate a pulse signal based on the counter value of the counter. The operational mode of the timer block is programmably configured using the programmable fabric and the signal wrapper.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings which are included as part of the present specification, illustrate the presently preferred embodiment and together with the general description given above and the detailed description of the various embodiments given below serve to explain and teach the principles described herein.

Figure 1:
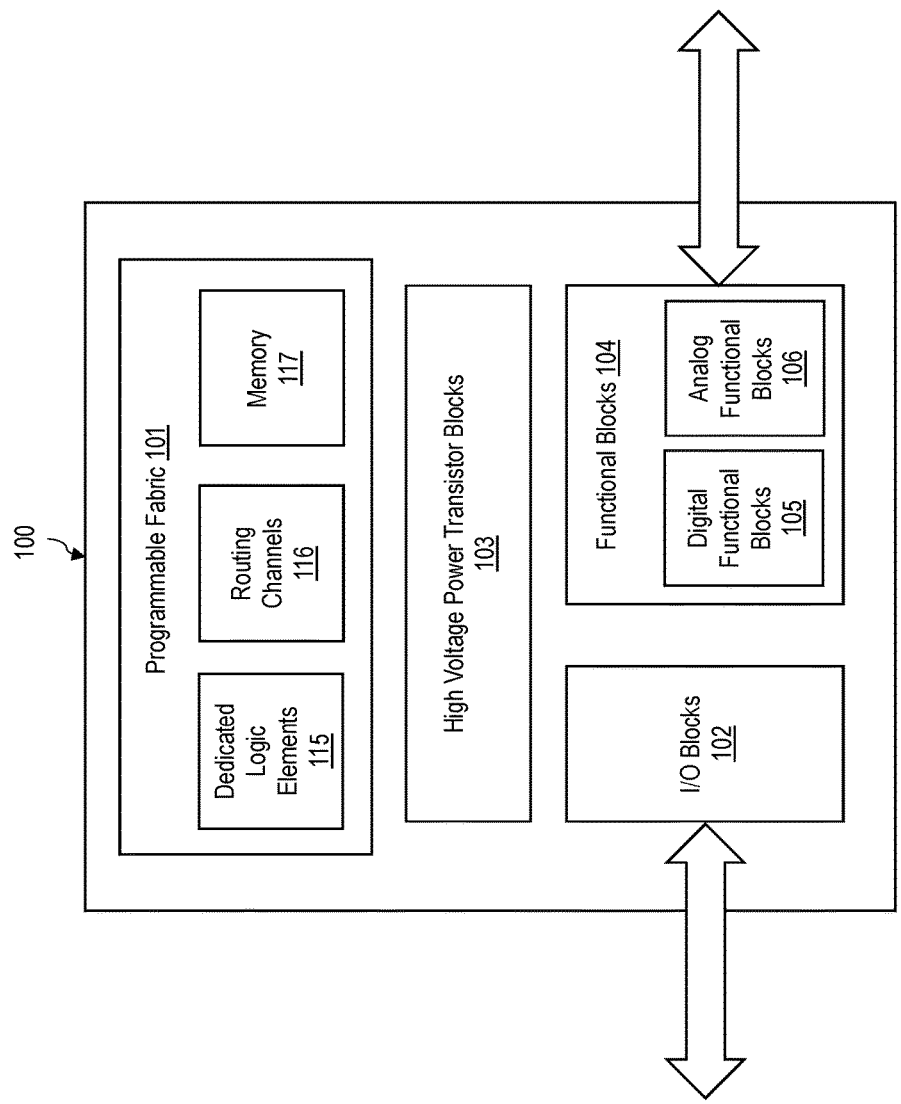
FIG. 1 shows a block diagram an example programmable logic device, according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a precision modulation timer integrated in a PLD. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulate and transforms data represented as physical (electronic) quantities within the computer system's registers and memories into other data similarly represented as physical quantities within the computer system memories or registers or other such information storage, transmission or display devices.

The algorithms presented herein are not inherently related to any particular computer or other apparatus. Various general-purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure generally describes a programmable logic device (PLD) integrated with various building blocks for providing a power solution and minimizing cost to market and a board space. In particular, the present disclosure relates to a precision modulation timer (PMT) block. The PMT block is wrapped around by a signal wrapper that can provide an interface to the programmable fabric and other adaptive blocks of the PLD.

The present PLD can provide a power management platform for high-voltage and high-power applications such as power management, power convertors, industrial control, automobile, etc. using one or more integrated power blocks. The present PLD can be used to integrate dissimilar rails on a single chip.

The PLD can be configured as various types of regulators, switches, muxes, battery chargers, switching controllers, gate drivers, etc. Example configurations of the PLD include, but are not limited to, a buck regulator (current or voltage mode), a boost regulator, a multiphase buck regulator (current or voltage mode), a buck-boost regulator (voltage mode), a source side regulator, a drain-side regulator, a push-pull DDR regulator, a load switch, a battery charger (trickle constant current or constant voltage, power path).

Each of the power blocks integrated in the present PLD has an on-demand topology for use in various applications. The present PLD can lower the power consumption by on-demand power on/off and sequencing rails, and on-demand monitoring to handle throttle conditions and marginal loads. In one embodiment, the present PLD can be configured as an on-demand multiple point-of-load (POL) integrator in various forms of power converters such as a point-of-load (POL) converter, a POL regulator, a POL module, and a POL system. Depending on a target application, the PLD can be programmed to function as an integrator combining one or more of a buck regulator (either current or voltage mode), a boost regulator, a buck-boost regulator, a low drop-out (LDO) regulator, a load switch, a mux, a battery charger, an external switching controller, and a gate driver. The PLD can also be programmed to function as a pulse width modulator (PWM) for providing constant current (CC) in a current mode or a constant voltage (CV) in a voltage mode, a pulse frequency modulator (PFM), or a pulse skipping modulator (PSM).

The present PLD can integrate one or more applications targeted for dissimilar rails to reduce a board size and lower a package cost. The present PLD enables a telemetry across different rails using one or more generic interfaces such as general-purpose input/output (GPIO), I2C interface, and serial peripheral interface (SPI) over the digital and analog I/O pins that can include physical pads. Using one or more of these interfaces or over a power management bus (e.g., PMBus™), the present PLD can communicate with an external device for a telemetry and a remote control. The present PLD can use the telemetry and the remote control for creating and integrating multiple dissimilar POLs. The present PLD can provide digital multiphase operation, for example, auto align/spread phases.

FIG. 1 shows a block diagram an example programmable logic device (PLD), according to one embodiment. The PLD 100 includes a programmable fabric 101, one or more I/O blocks 102, one or more high voltage power transistor blocks 103, and one or more functional blocks 104. In some embodiments, the PLD 100 is referred to as a power management integrated circuit (PMIC). The PMIC can convert one or more low power voltage inputs to one or more high power voltage outputs or convert one or more high voltage inputs to one or more low power voltage outputs.

The programmable fabric 101 includes a number of uncommitted programmable logic elements including one or more dedicated logic elements 115 and routing channels 116. The dedicated logic elements 115 can include a plurality of flip flops and logic gates. The dedicated logic elements 115 and the routing channels 116 of the programmable fabric 101 can be programmed to selectively and programmably connect the I/O blocks 102, the high voltage power transistor blocks 103, and the dedicated logic elements 115 via the routing channels 116 to form one or more dedicated functions.

The programmable fabric 101 can include a memory 117 including a volatile memory (e.g., a static random-access memory (SRAM)), a non-volatile memory (e.g., a flash memory), or both. The memory 117 may include one or more look-up tables for digital compensation.

The I/O blocks 102 can include one or more digital and/or analog inputs and output buffers. Each of the I/O blocks 102 can receive signals from and transmit signals to an external device in a configurable voltage and current. In one embodiment, the I/O blocks 102 can handle signals of a low voltage (up to 5V) and low current (up to 50 mA).

The PLD 100 can include any number of high voltage power transistor blocks, for example, four, eight, and twelve depending on a size of the chip and requirement for an intended application. The high voltage power transistor blocks 103, herein also referred to as scalable integrated MOSFET (SIM) blocks, can be configured and programmed to be a constituent block or element of a more complex circuit or device, in one embodiment, the high voltage power transistor blocks 103 can support voltages ranging from 12V to 80V and current up to 12 A. The voltage and current limits that the high voltage power transistor blocks 103 can support may vary depending on an intended power application and the process technology used for manufacturing the PLD 100. According to one embodiment, the high voltage power transistor blocks 103 can integrate both n-channel and p-channel FETs.

According to one embodiment, the source and the drain of each the high voltage power transistors in the high voltage power transistor blocks 103 can be connected to external circuits and/or devices. The I/O pins of the I/O blocks 102 are primarily used for interfacing digital and analog sensory signals to and from an external device or component, and may not include the source and drain (or boost pin) of the high voltage power transistors. The presence of one or more high voltage power transistors on the same chip can provide flexible configurations of the PLD 100 by programming the programmable fabric 101. For example, different high voltage power transistors on the same chip can connect to different external power rails or sensor hubs. In another example, the high voltage power transistors can be externally connected in series via the source and the drain of the high voltage power transistors. The programmable fabric 101 can be programmed to connect the I/O blocks 102, the high voltage power transistor blocks 103, and the integrated logic elements 115 using the programmable routing channels 116 in various configurations to accommodate a wide range of power applications.

The functional blocks 104 can include one or more of digital functional blocks 105, analog functional blocks 106, or a combination of both. A digital functional block 105 can provide dedicated functions such as a serial interface, a communication protocol, and an application-specific control function. An analog functional block 106 can be an analog-to-digital converter (ADC), a comparator, a sensor, an amplifier, a voltage reference, a digital-to-analog converter (DAC), etc. The parameters of each of these functional blocks 104 such as a gain, a reference voltage, a frequency, a resolution can be configured by the programmable fabric 101. In addition, the programmable fabric 101 can programmably connect different functional elements within the functional blocks 104. Some of the functional blocks 104 such as a reference voltage can be available via external pins of the I/O blocks 102.

According to one embodiment, the programmable fabric 101 can take a form of a field programmable gate array (FPGA). The FPGA contains an array of programmable logic blocks (e.g., the dedicated logic elements 115) and reconfigurable interconnects (e.g., the routing channels 116) to programmably wire the logical blocks together using the reconfigurable interconnects. The logic blocks may include simple logic gates like AND gates and XOR gates and flip-flops or more complex blocks such as memory elements. The logic blocks and the reconfigurable interconnects can be configured to perform complex combinational functions in conjunction with the functional blocks 104.

According to one embodiment, the programmable fabric 101 may include a digital fabric and an analog fabric. The digital fabric corresponds to a portion of the programmable fabric 101 that provides digital interfaces among the constituent blocks including the I/O blocks 102, the high voltage power transistor blocks 103, and the digital functional blocks 105. For example, the digital fabric can provide the connectivity among the integrated analog blocks, digital logic elements, timers, I/Os, etc. The analog fabric corresponds to a portion of the programmable fabric 101 to provide analog interfaces with one or more external telemetry and sensor blocks, an I2C interface, an SPI interface, etc.

According to one embodiment, a high voltage power transistor implemented in the high voltage power transistor blocks 103 is a software-defined and programmable, configurable, optimizable, and scalable power MOSFET. The PLD 100 including such power MOSFETs can accelerate time to market for new products and standards and achieve a competitive response while lowering the capital and operational expenditure, and inventory. The programmability of the present PLD can provide flexibility in design and facilitate the implementation of user-configurable and field-programmable solutions and topologies in a developmental stage of a new product as well as in a commercialization stage for providing optimizable solutions to customers by offering flexible solutions depending on the needs and requirements of a target application.

The present PLD includes one or more analog functional blocks that are adaptive for providing various user-configurable analog functions. The adaptive analog blocks are wrapped with respective signal wrappers on the programmable fabric. The programmable fabric provides a programmable environment to build user-configurable custom analog functions by digitally or combining one or more adaptive analog blocks by selectively and programmably interconnecting and combining the signal wrappers that provide interface to the adaptive analog blocks. The signal wrappers of the adaptive analog blocks eliminate the need to directly interconnect and/or interface analog blocks in an analog fashion with a variety range of voltages, currents, common mode, isolation, noise isolation issues, or the like. Using the present adaptive analog blocks, analog functions can be readily built on demand targeting specific applications while meeting the requirements for the target applications.

According to one embodiment, the present disclosure provides an analog and digital adaptive platform for implementing various analog functions using adaptive analog blocks that are configurable and programmable in a digital domain. The adaptive analog blocks that are wrapped with signal wrappers can provide ease of fabrication and packaging various custom analog functions in a small chip size with a low cost compared to conventional analog ICs. The present adaptive platform can provide flexibility and adaptability for various circuit designs and implementing on-demand analog functions adaptable to various applications on a single chip.

Examples of analog functions that the present adaptive platform can provide include, but are not limited to, switching converters, linear regulators, load switches, battery chargers, and external switching controllers. Beyond power applications, a broad spectrum of applications that the present adaptive platform is applicable to includes Internet of Things (IoT) devices, drones, electric vehicles (EVs), robotics, and various industrial applications utilizing external sensors for proximity, motion, position, tachometer, pitch, axis, yaw, light, pressure, temperature, humidity. The signal wrapper of the present adaptive platform can provide a digital PID control to various analog actuators including, but not limited to, DC motors, servo motors, stepper motors, motion control, breakers, fan controllers.

Figure 2A:
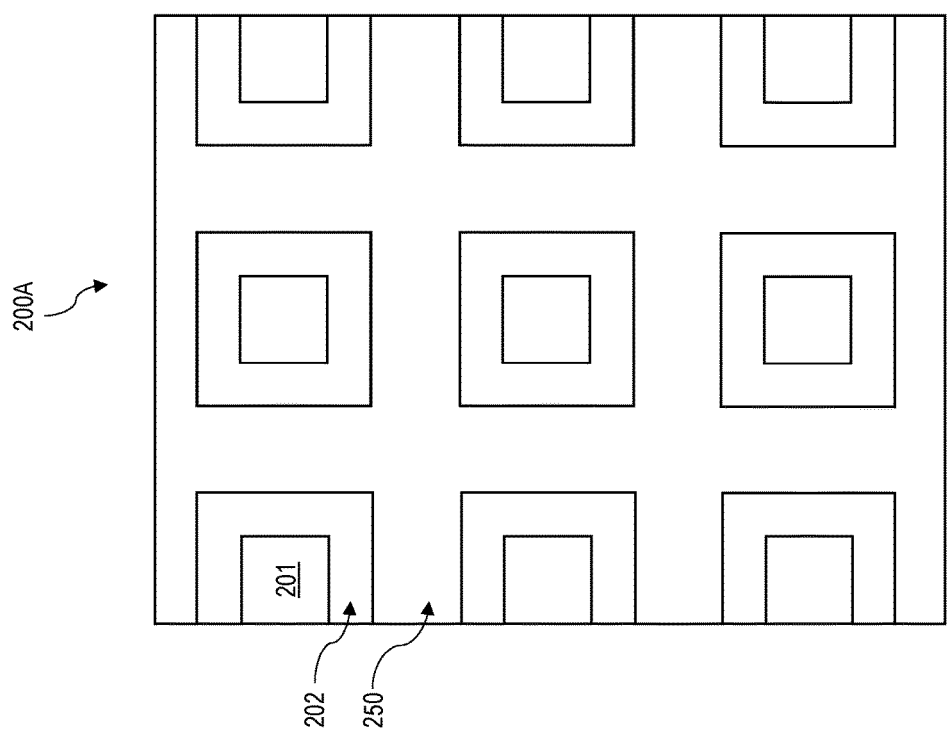
FIG. 2A illustrates a schematic block diagram of an analog and digital adaptive platform, according to one embodiment.

FIG. 2A illustrates a schematic block diagram of an analog and digital adaptive platform, according to one embodiment. The analog and digital adaptive platform 200A includes a plurality of analog and digital adaptive blocks 201 interconnected with signal wrappers 202 on a programmable fabric 250. Referring to FIG. 1, the adaptive blocks 201 correspond to any of the high voltage power transistor blocks 103, the digital functional blocks 105, and the analog functional blocks 106. Each of the adaptive blocks 201 arranged on the programmable fabric 250 is user-configurable and programmable by the coupled signal wrapper 202 to provide a user-configurable function for a target application or one or more circuit components of a target application.

A signal wrapper 202 provides an interface circuitry required for the coupled adaptive block 201 to interconnect with another adaptive block 201 and or an I/O block (e.g., I/O block 102 of FIG. 1) via the programmable fabric 250. According to one embodiment, the analog and digital adaptive platform 200A includes a predetermined number of adaptive blocks 201. Examples of the adaptive blocks 201 include, but are not limited to, an analog-to-digital converter (ADC) block, a comparator block, a memory block, a pulse-width modulation (PWM) block, a voltage reference block, and a timer block. In conjunction with one or more programmable analog and digital input/output (I/O) blocks (e.g., the I/O blocks 102 of FIG. 1), these adaptive blocks 201 can be programmably configured to build a variety of analog circuitry for various applications via the programmable fabric 250.

According to one embodiment, a signal wrapper 202 can include both a digital wrapper for providing interfaces for digital signals and an analog wrapper for providing interfaces for analog signals to the corresponding adaptive blocks 201. The programmable fabric 250 can include a digital fabric and an analog fabric. In this case, the digital wrapper of the signal wrapper 202 interfaces with the digital fabric of the programmable fabric 250, and the analog wrapper of the signal wrapper 202 interfaces with the analog fabric of the programmable fabric 250.

According to one embodiment, each of the adaptive blocks 201 or a combination of multiple adaptive blocks 201 is programmed over the programmable fabric 250 to build a variety of analog circuitry for various power applications. Examples of such power applications include, but are not limited to a switching converter, a linear regulator, a load switch, a sensor, a battery charger, and an external switching controller. According to other embodiments, each of the adaptive blocks 201 or a combination of multiple adaptive blocks 201 is programmably configured to build a variety of analog circuitry for various non-power applications. Examples of non-power applications include, but are not limited to, an Internet of Things (IoT) device, a drone, an electric vehicle (EV), a robot, and various industrial applications utilizing one or more external sensors for sensing proximity, motion, position, tachometer, pitch, axis, yaw, light, pressure, temperature, humidity, etc. In conjunction with the adaptive blocks 201 and one or more of functional blocks (e.g., the functional blocks 104 of FIG. 1) and I/O blocks (e.g., the I/O blocks 102 of FIG. 1), the signal wrappers 202 of the analog and digital adaptive platform 200A can provide a digital proportional-integral-derivative (PID) control to various analog actuators including, but not limited to, a DC motor, a servo motor, a stepper motor, a motion control, breakers, and a fan controller.

Figure 2B:
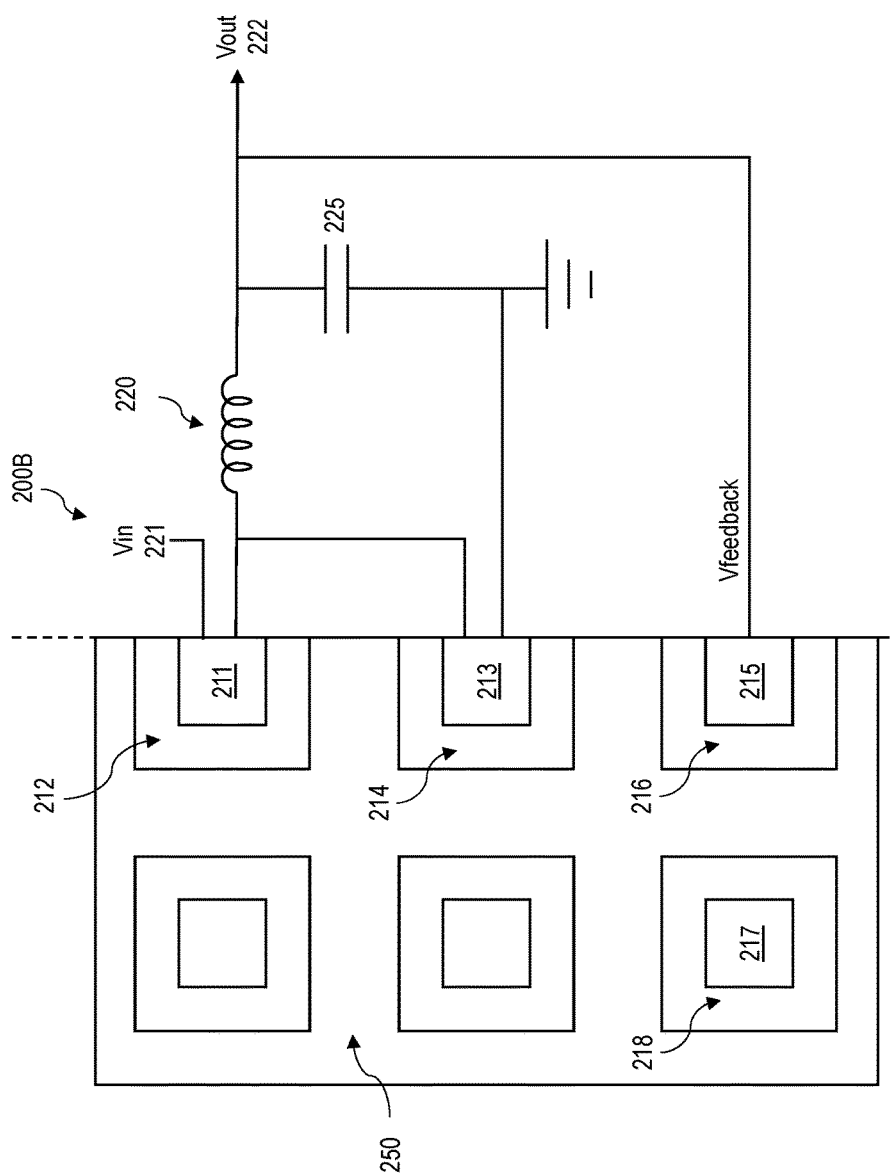
FIG. 2B illustrates an example of the analog and digital adaptive platform of FIG. 2A configured as a hysteretic mode buck switching converter, according to one embodiment.

FIG. 2B illustrates an example of the analog and digital adaptive platform of FIG. 2A configured as a hysteretic mode buck switching converter, according to one embodiment. The hysteretic mode buck switching converter 200B may also be referred to as a bang-bang buck switching converter. The hysteretic mode buck switching converter 200B is a DC-to-DC step-down power converter that converts an input voltage Vin 221 to an output voltage Vout 222 that is lower than the input voltage. The output current may be stepped up while the input voltage is stepped down. The hysteretic mode buck switching converter 200B can provide an efficient power conversion compared to a linear regulator that lowers the input voltage by dissipating power as heat without stepping up the output current.

The analog and digital adaptive platform 200B can be an example of the analog and digital adaptive platform 200A shown in FIG. 2A. For example, the adaptive blocks 211, 213, 215 and 217 are instances of the adaptive blocks 201 of FIG. 2A, the signal wrappers 212, 214, 216, and 218 are instances of the signal wrapper 202 of FIG. 2A. Each of the adaptive blocks 211, 213, 215 and 217 can be one of a comparator block, a memory block, a PWM block a voltage reference block, and a timer block.

In the present example, the adaptive block 215 is a comparator block. According to one embodiment, the comparator block is included in the analog functional blocks 106 of FIG. 1. The adaptive blocks 211 and 213 drive a filter including an inductor 220 and a capacitor 225 in a synchronous mode. The feedback voltage, $V_{feedback}$, of the filter output 222 (e.g., 1.0V, 4 A) is connected to the comparator block 215. Various internal connections and routing channels are configured to interconnect the adaptive blocks 211, 213, 215 and 217. For example, the adaptive block 217 and the adaptive block 215 are interconnected using the signal wrapper 218 that provides a digital interface to the adaptive block 217, and the signal wrapper 216 that provides a digital interface to the adaptive block 215 via the programmable fabric 250. In a similar fashion, the adaptive block 217 and the adaptive block 213 can be interconnected with the signal wrapper 218 and signal wrapper 214, and the adaptive block 217 and the adaptive block 211 can be interconnected with the signal wrapper 218 and the signal wrapper 212 via the programmable fabric 250. In this example, the adaptive blocks 211, 213, 215 and 217 are configured as a hysteretic mode buck switching converter to provide a stepped-down voltage output.

Figure 3A:
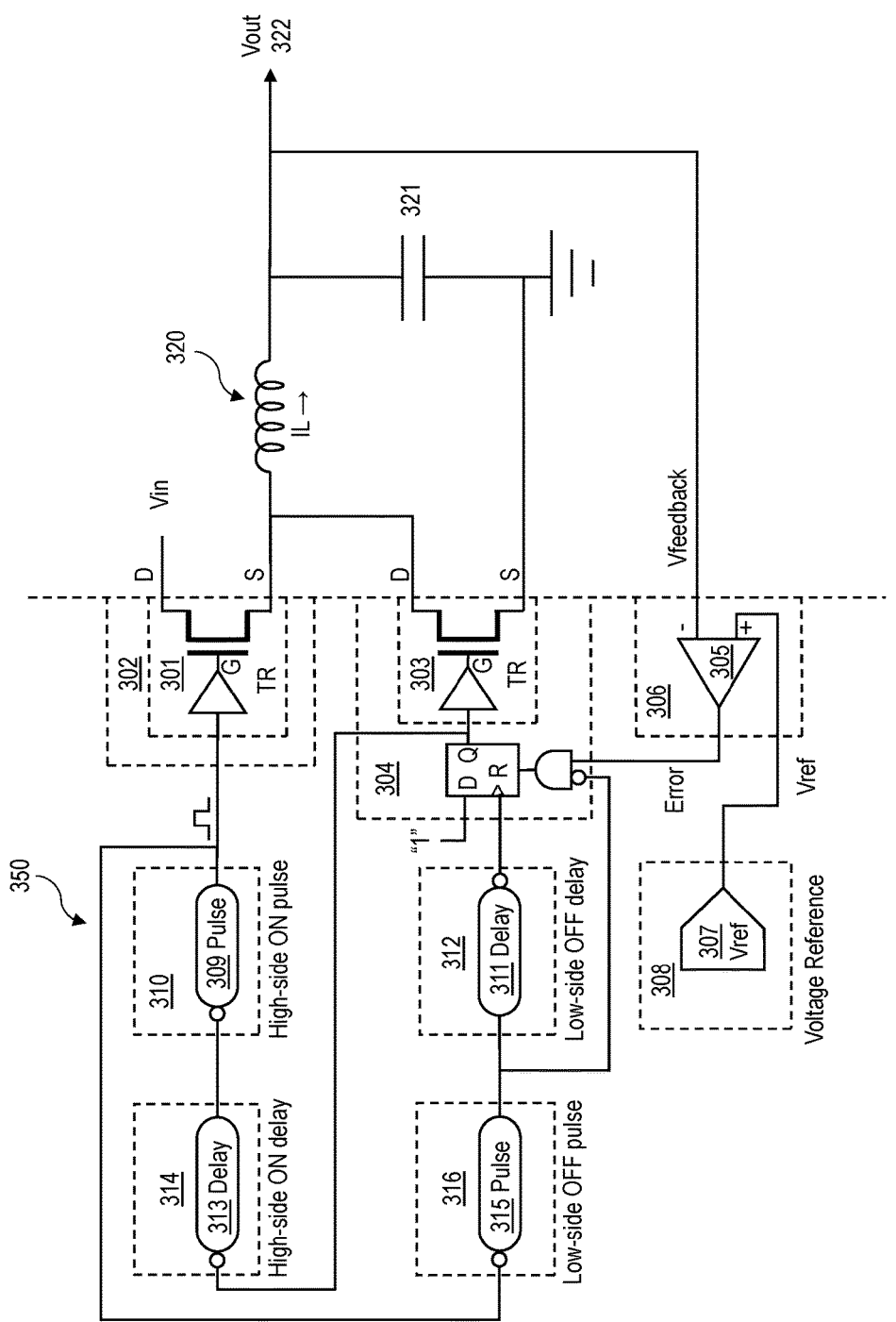
FIG. 3A illustrates a schematic diagram of an example hysteretic mode buck switching converter, according to one embodiment.
Figure 3B:
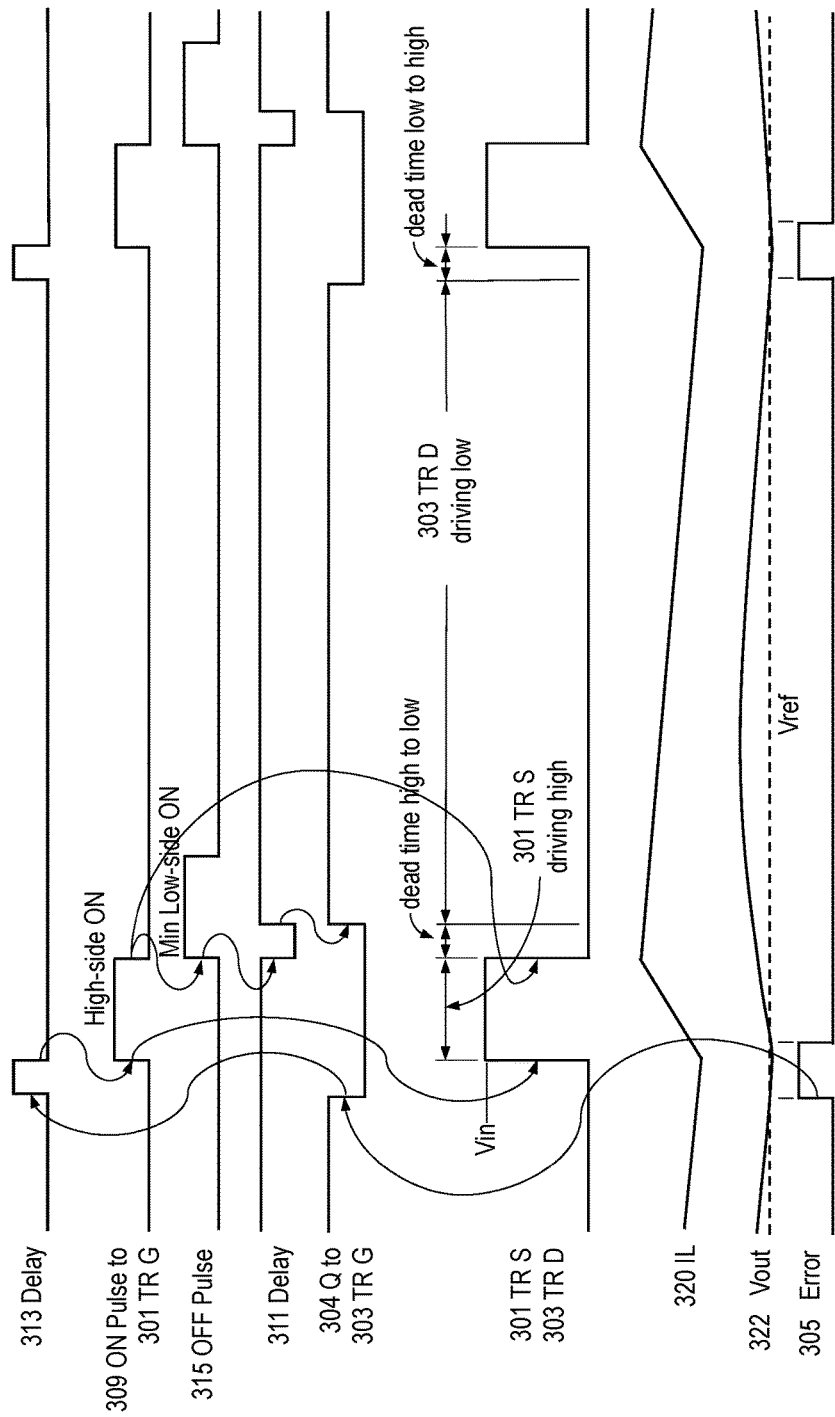
FIG. 3B is a signal diagram for the example hysteretic mode buck switching converter of FIG. 3A.

FIG. 3A illustrates a schematic diagram of an example hysteretic mode buck switching converter, according to one embodiment. The hysteretic mode buck switching converter shown in FIG. 3A may also be referred to as a bang-bang buck switching converter. FIG. 3B is a signal diagram for the example hysteretic mode buck switching converter of FIG. 3A. Although the present example shows an example of the analog and digital adaptive platform configured as a hysteretic mode buck switching converter, it is understood that the present adaptive platform can be configured as other devices including, but not limited to, a voltage mode buck switching converter, a current mode buck switching converter, a boost regulator, a buck-boost regulator, a low drop-out (LDO) regulator, a load switch, a mux, a battery charger, as external switching controller, a gate driver, and an integrator combining one or more thereof.

The programmable fabric can include a plurality of adaptive blocks, 301, 303, 305, 307, 309, 311, 313, and 315, each of which wrapped with respective signal wrappers 302, 304, 306, 308, 310, 312, 314, and 316. Among the adaptive blocks, the adaptive blocks 301 and 303 are high voltage power transistor blocks, the adaptive block 305 is a comparator block, the adaptive blocks 309, 311, 313, and 315 are timer blocks, and the adaptive block 307 is a voltage reference block.

Each of the high voltage power transistor blocks (e.g., the high voltage power transistor blocks 301 and 303) can be programmed for a specific target application and configured as, for example, but not limited to, a switcher, a linear operator, a current sense, and a protector. In the present example, the high voltage power transistor blocks 301 and 303 are programmed and configured as a switcher driving a high current output.

The comparator block 305 is configured to compare a voltage difference between an internal reference from the voltage reference block 307 and an external analog I/O signal $V_{feedback}$.

A timer block (e.g., the timer blocks 309, 311, 313, and 315) can be programmed to generate nanosecond, microsecond, and millisecond delays or pulses. The timer block can provide a precision dead-time control for improved efficiency. In the present example, the timer blocks 309 and 315 provide a constant-on-time pulse, and the timer blocks 311 and 313 are timers with a fixed delay specified by configuration.

A voltage reference block (e.g., the voltage reference block 307) can be used to provide a digitally-adjustable precision voltage reference. The voltage reference block can also provide protection for over current (OCP), over voltage (OVP), over temperature protection (OTP), under voltage-lockout (UVLO) references. In the present example, the voltage reference block 307 provides a fixed volume reference specified at configuration, which provides the desired output voltage, $V_{ref}$.

The high voltage power transistor blocks 301 and 303 can drive the filter inductor 320 and the capacitor 321 in a synchronous mode as described in the signal diagram of FIG. 3B. The feedback voltage, $V_{feedback}$, from the filter output 322, $V_{out}$, is externally connected to the comparator block 305. The comparator block 305 compares the feedback voltage $V_{feedback}$ with a reference voltage, $V_{ref}$ to produce an error signal, Error=true if $V_{ref} \geq V_{feedback}$, or false if $V_{ref} < V_{feedback}$. The reference voltage, $V_{ref}$ is supplied from the voltage reference block 307 interconnected with the signal wrapper 308 and the signal wrapper 306 via the programmable fabric 350.

When the error signal 305 is true, the D-type flip-flop in the signal wrapper 304 is reset to turn off the high voltage power transistor block 303 and start the delay timer block 313. After this delay, the timer block 309 generates a constant-on-time pulse to turn on the high voltage power transistor block 301 through the connection made with signal wrapper 310 and signal wrapper 302 via the programmable fabric 350. The high voltage power transistor block 301 drives the inductor 320 to charge the output capacitor 321. When the pulse is completed, the falling edge of the pulse starts the minimum low-side ON pulse of the timer block 315 and sets the D-type flip-flop in the signal wrapper 304 after a fixed delay determined by the timer block 311 as shown in the signal diagram of FIG. 3B through the connection established with the signal wrapper 312 and the signal wrapper 304, and the connection established with the signal wrapper 310 and the signal wrapper 316 via the programmable fabric 350. The fixed delay is specified to ensure that the high-drive voltage power transistor block 301 is off, dead time, before the low-drive high voltage power transistor block 303 is turned on, preventing momentary shoot-through current as shown in the signal diagram of FIG. 3B. The D-type flip-flop in the signal wrapper 304 turns on the high voltage power transistor block 303 driving the inductor 320 to discharge the output capacitor 321.

The next cycle begins by first tuning off the low-side high voltage power transistor block 303 with a fixed delay reset pulse from the timer block 313 where the fixed delay is specified to ensure that the low-drive high voltage power transistor block 303 is off, dead time, before the high-drive voltage power transistor block 301 is turned on by the timer block 309, again, preventing momentary shoot-through current as shown in the signal diagram of FIG. 3B.

Figure 4:
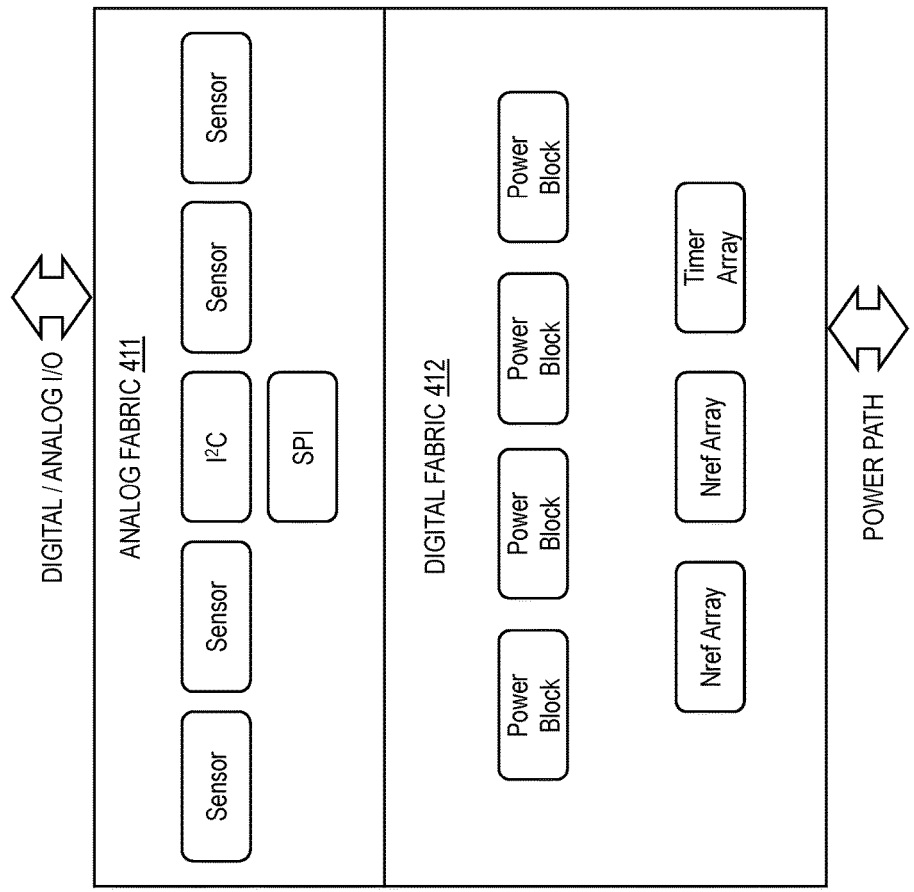
FIG. 4 shows a block diagram of an exemplary programmable logic device, according to one embodiment.

FIG. 4 shows a block diagram of an exemplary programmable logic device, according to one embodiment. The programmable fabric 101 of FIG. 1 may include an analog fabric 411 and a digital fabric 412. The analog fabric 411 corresponds to a portion of the programmable fabric 101 to provide analog interfaces with one or more external telemetry and sensor blocks, an I2C interface, an SPI interface, etc. The digital fabric 412 corresponds to a portion of the programmable fabric 101 that provides digital interfaces among the constituent blocks including the high voltage power transistor blocks 103, and the digital functional blocks 105 including a voltage reference (Nref array) and a timer array. For example, the digital fabric 412 can provide a power path and the connectivity among the integrated analog blocks, digital logic elements, timer arrays, I/O blocks, etc.

It is noted that FIG. 4 is only an example of the present PLD, and it is understood that the present PLD can include any number of power and sensor blocks, for example, four, eight, and twelve power and sensor blocks, and any type of digital and/or analog I/O interfaces without deviating from the scope of the present disclosure.

The present PLD can provide a software-defined and programmable, configurable, and optimizable power MOSFET. The present PLD including software-defined, programmable, and scalable power MOSFETs can accelerate time to market optimizable for new products and standards, accelerate competitive response, lower capital expenditure, operational expenditure, and inventory. The programming and configurability of the present PLD can be easily used to implement new ideas, solutions, and topologies.

The software component of the PLD can be programmed to configure various components, elements, and functions the PLD to configure the PLD as various types of regulators, switches, muxes, battery chargers, switching controllers, gate drivers, etc. Exemplary applications of the present PLD include, but are not limited to, a buck regulator (current or voltage mode), a boost regulator, a multiphase buck regulator (current or voltage mode), a buck-boost regulator (voltage mode), a source side regulator, a drain-side regulator, a push-pull DDR regulator, a load switch, a battery charger (trickle constant current or constant voltage, power path).

According to one embodiment, the present PLD can include one or more precision modulation timer (PMT) blocks. The PMT block can lower a system frequency (e.g., by 100 times) for boosting efficiency of the PLD. Each of the PMT blocks can include one or more timers (e.g., four timers). According to one embodiment, the PMT block can be configured as a dynamic PMT block or a static PMT block using the programmable fabric of the PLD. A PMT block can be configured as a timer with a programmable delay, for example, nanosecond, microsecond, and millisecond. The delays may be fixed or dynamic ranging from nanoseconds, milliseconds, microseconds to seconds with resolution less than one nanosecond. Various numbers of delays (e.g., 64) are available depending on a range of the delays. For example, each PMT block can have four delays. For a PLD including 16 PMT blocks can have up to 64 delays in total. The delays can be configured for a nano delay (e.g., 5-bit delay) or an extended delay (e.g., 12-bit delay). It is understood that the PLD may be configured to contain any number of PMT blocks and delays depending on a target application. The programmable delay can be a fixed delay or a variable delay. According to another embodiment, the PMT block can be also configured to function as a stopwatch using the programmable delay. The PMT block can provide a precision time control (e.g., PMT 312 and PMT 314 in FIG. 3A) with an improved efficiency. The PMT block can also be used as a dynamic precision modulation timer (e.g., PMT 853 in FIG. 8).

Figure 5:
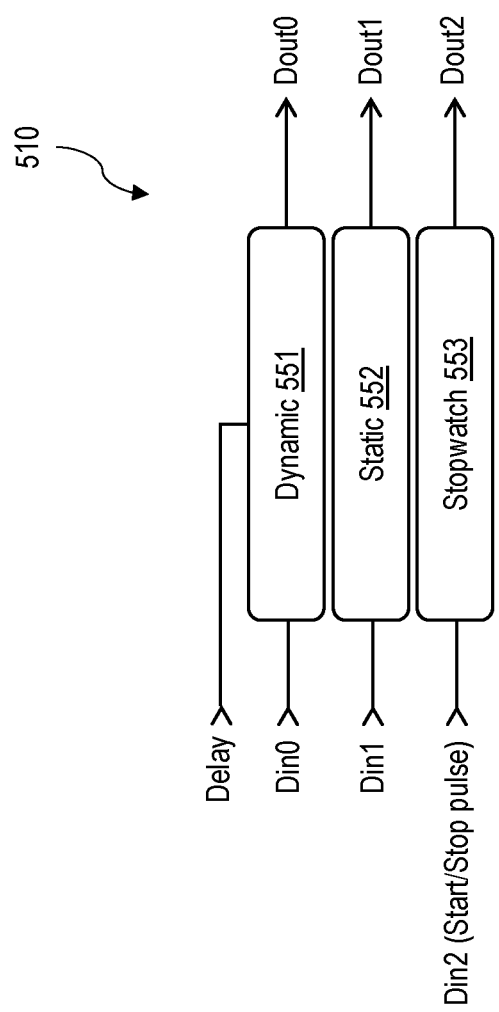
FIG. 5 shows examples of a PMT block, according to one embodiment.

FIG. 5 shows examples of a PMT block, according to one embodiment. The PMT block 510 can be configured as a dynamic timer, a static timer, or a stopwatch. A dynamic timer is a timer that is dynamically loaded from the programmable fabric. For example, a dynamic timer can be loaded to receive a modulation value that is output from a compensation memory block to change a switching frequency of a high voltage power transistor block. A static timer is a timer that is loaded at configuration of the PMT block and provides a static time delay when it is triggered. A stopwatch measures a time from a trigger pulse to a stop pulse.

Referring to FIG. 4, the digital fabric 412 of the present PLD can include a timer array of PMT blocks. The timers in the timer array can be configured independent from each other. In the present example, a single PMT block can include the timer array 510 that can be configured as a dynamic timer 551, a static timer 552, or a stopwatch 553 using a signal provided from the programmable fabric. The dynamic timer 551 receives an input Din0 and provides an output Dout0 with a programmable delay. The static timer 552 includes an input Din1 and provides an output Dout1 with a static delay. The stopwatch 553 receives a start/stop signal pulse and provides an output Dout2. The output Dout2 of the stopwatch 553 can be digital counts of an internal counter with a programmable delay from the start pulse. The programmable delay can be programmed using the programmable fabric. The output Dout2 can be reset after the stop pulse is received.

Figure 6:
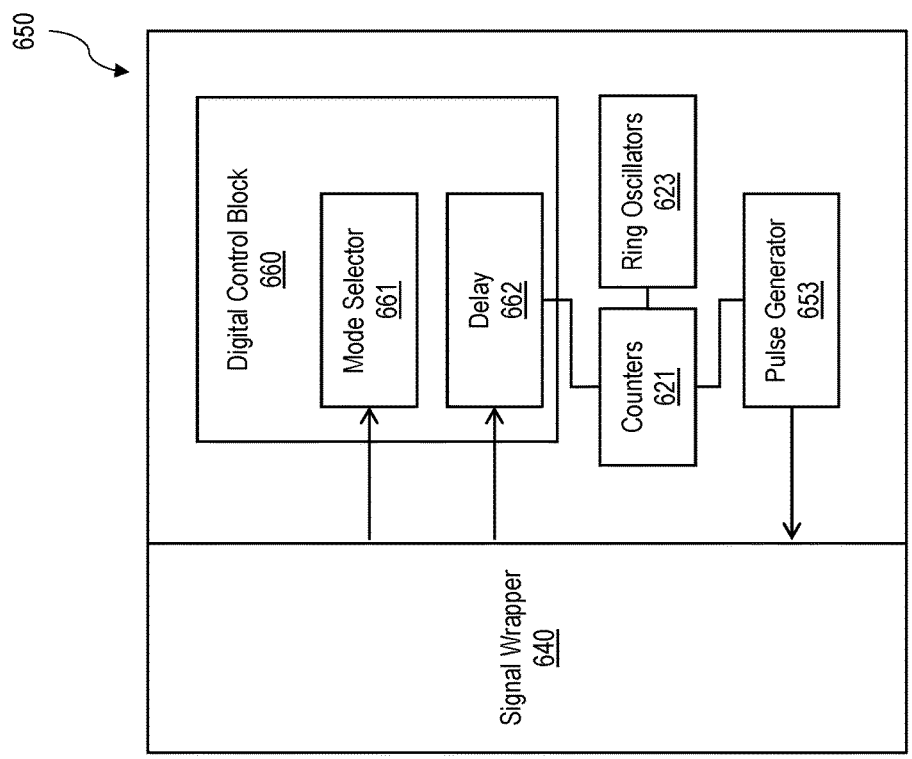
FIG. 6 shows a block diagram of an example PMT block, according to one embodiment.

FIG. 6 shows a block diagram of an example PMT block, according to one embodiment. The PMT block 650 has a digital control block 660 including a mode selector 661, a programmable delay block 662, one or more counters 621, one or more ring oscillators 623, and a pulse generator 653. The inputs and outputs of the PMT block 650 may be provided to and from other adaptive blocks (e.g., a high voltage power transistor block, a threshold comparator block, another timer block, a compensation memory block) of the PLD via the signal wrapper 640 of the PMT block 650. The signal wrapper 640 may be included in the programmable fabric of the PLD. Using the mode selector 661, the PMT block 650 can be configured to operate in various modes, for example, a dynamic mode, and a static mode, a rising-edge mode, a falling-edge mode, a soft-start mode, a soft-stop mode, a precision delay mode.

For example, the PMT 650 can be configured to provide a timer with 0.625 ns resolution and 1% tolerance including a trimmable band gap for a reference signal. In this case, the ring oscillator 623 operates at a frequency to provide a minimum resolution of 0.625 ns per phase. This minimum phase decrements the counter 621 to zero from the initially specified delay value. The ring oscillator 623 has 1% tolerance that can be set by a trimmable band-gap reference. In another example, the PMT 650 can provide through-ON and through-OFF timing for a switch of a high voltage power transistor block integrated in the PLD. The output signal of the PMT block 650 can also be configured to be hysteretic, for example, ON before OFF and OFF before ON. The PMT block 650 can have constant on-time (COT) and constant off-time (COF) delays. COT and COF pulses with COT and COF delays can be generated by the pulse generator 653 using the delays provided by the programmable delay block 662. For example, the COT pulse drives a pulse width of a high-side of a high voltage power transistor, and the COF pulse drives an off cycle of the pulse width the high-side of a high voltage power transistor for a specified COT.

According to one embodiment, the PMT block 650 can provide a protection delay. The PMT block 650 can provide programmable delays for protection by sequencing voltage regulators of the PLD on or off in a specified order. A power good signal from one voltage regulator can drive the programmable delay block 662 from the signal wrapper 640. After a specified delay, the pulse generator 653 provides a trigger out signal TrigOut[x] to drive another voltage regulator using an enable input through the signal wrapper 640.

According to one embodiment, the PMT block 650 provides precision delays for a pulse width modulation (PWM) signal. In some embodiments, the precision delay of the PMT block 650 can be used for a turn-on time, and a turn-off time for the integrated high voltage power transistor in the PLD. In other embodiments, the precision delay of the PMT block 650 can be used for a sample timing of a sensor (e.g., a sensor block included in the analog fabric 411 of FIG. 4 or an external sensor that is connected via the I/O blocks 102 of FIG. 1).

Figure 7A:
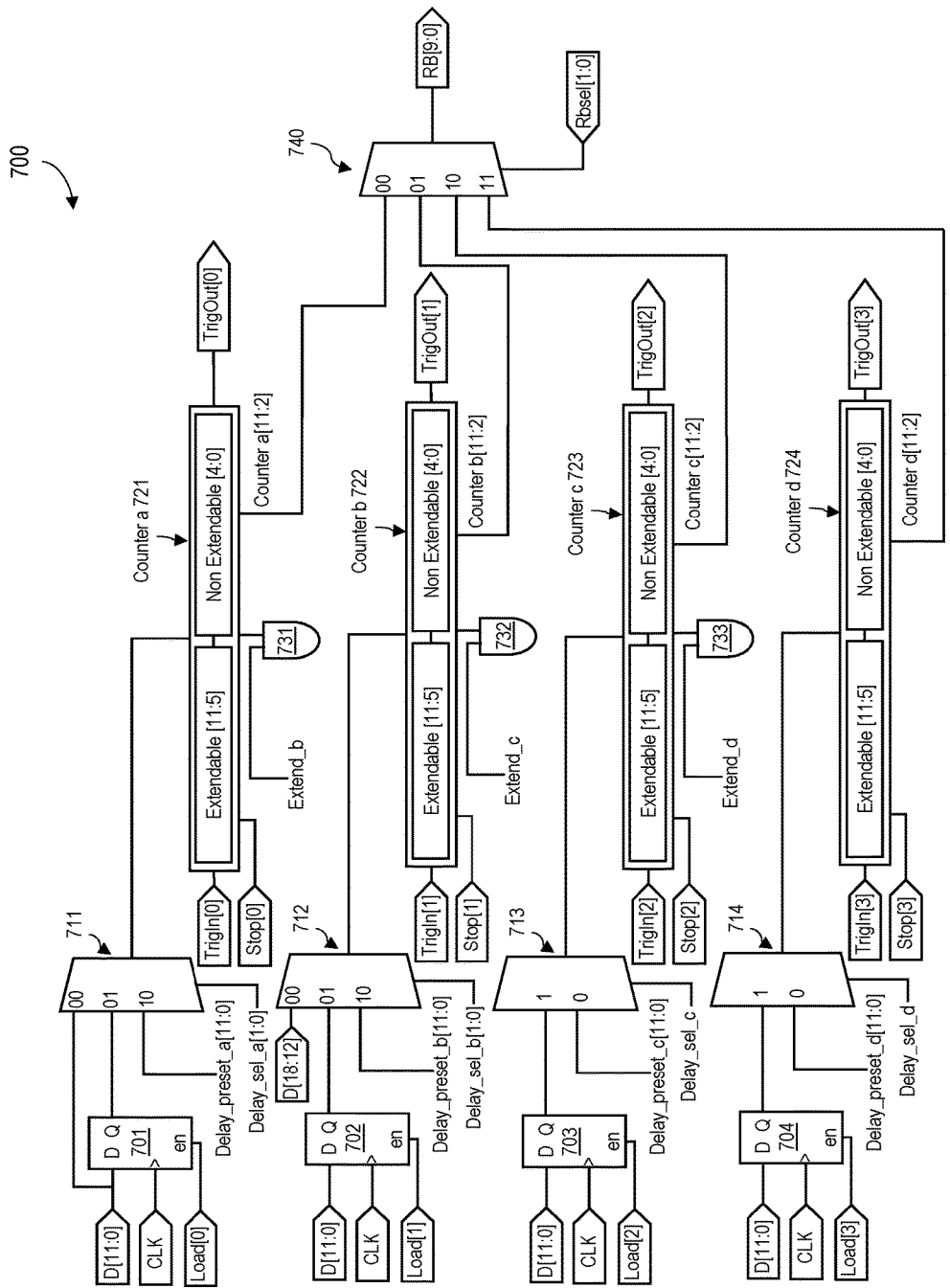
FIG. 7A shows a circuit diagram of an example PMT block, according to one embodiment.

FIG. 7A shows a circuit diagram of an example PMT block, according to one embodiment. The PMT block 700 includes four counters 721, 722, 723, and 724. For example, the counters 721, 722, 723, and 724 are a 12-bit counter that is divided into extendable bits (e.g., higher 7 bits of the 12-bit counter) and non-extendable bits (e.g., lower 5 bits of the 12-bit counter). Each of the counters 721, 722, 723, and 724 is driven with a corresponding ring oscillator (not shown) using signals provided by the programmable fabric including trigger-in signals TrigIn[x] and a stop input Stop[x], and drives out the trigger-out signal TrigOut[x]. The trigger-in signal TrigIn[x] starts the counter and asserts the trigger-out signal TrigOut[x]. On completion of a specified delay of the counter or the assertion of a stop signal Stop[x], the trigger-out signal TrigOut is de-asserted. The trigger-out signal TrigOut[x] can be used to generate a PWM signal to drive a switch of a high voltage transistor block integrated in the PLD.

The specified delay can be dynamically loaded into the counters 721, 722, 723, and 724 on the assertion of the trigger-in signal TrigIn. The 12-bit delay value D[11:0] may be received from the programmable fabric or input registers 701, 702, 703, and 704. The input registers 701, 702, 703, and 704 may be loaded any time from the programmable fabric with the data input D[11:0] when the input signal Load is asserted on a rising edge of the clock signal CLK from the programmable fabric. Alternatively, delay preset signals Delay_preset_x[11:0] and Delay_sel_x[1:0] (x=a, b, c, or d) can be fed to the data selectors 711, 712, 713, 714 from the programmable fabric instead of the 12-bit delay value D[11:0] to load preset delay signals. The data selector 712 can be configured to receive higher bits of the input data D[18:12] of the total of 19 bits of the input data D[18:0].

On the assertion of trigger-in signal TrigIn, the 12-bit counters 721, 722, 723, and 724 decrement the loaded value down to zero, then de-asserts trigger-out signal TrigOut. A time resolution of the counter (e.g., 0.625 ns) may be trimmed to a tolerance of less than ±1%.

Each of the counters 721, 722, and 723 may extend their most significant 7-bits to the next higher-bit counter. For example, the counter 721 can be extended to the counter 722 via an extension multiplexor 731, and the counter 722 can be extended to the counter 723 via an extension multiplexor 732, and the counter 723 can be extended to the counter 724 via an extension multiplexor 733. In this case, the resulting extended counter is one 33-bit counter with a maximum delay of 0.625 ns*2^33 that equate 5.4 seconds, leaving three non-extendable 5-bit counter 722, 723, and 724 with a maximum delay of 0.625 ns*2^5 that equals 20 ns. The higher 10-bits [11:2] of the counters 721, 722, 723, and 724 are fed to a data selector 740 that provides a 10-bit digital output signal RB[9:0] based on the 2-bit selection signal Rbsel[1:0]. The lower 2 bits of the counters 721, 722, 723, and 724 can be used for the four phases of the ring oscillator and decoding when the ring oscillator starts. The output signals Dout0, Dout1, and Dout2 shown in FIG. 5 can be output using the output signal RB as multiplexed due to the limited number of I/O pins available on the programmable fabric. The 2-bit selection signal Rbsel[1:0] can select the higher 10-bits of the selected counter.

Figure 7B:
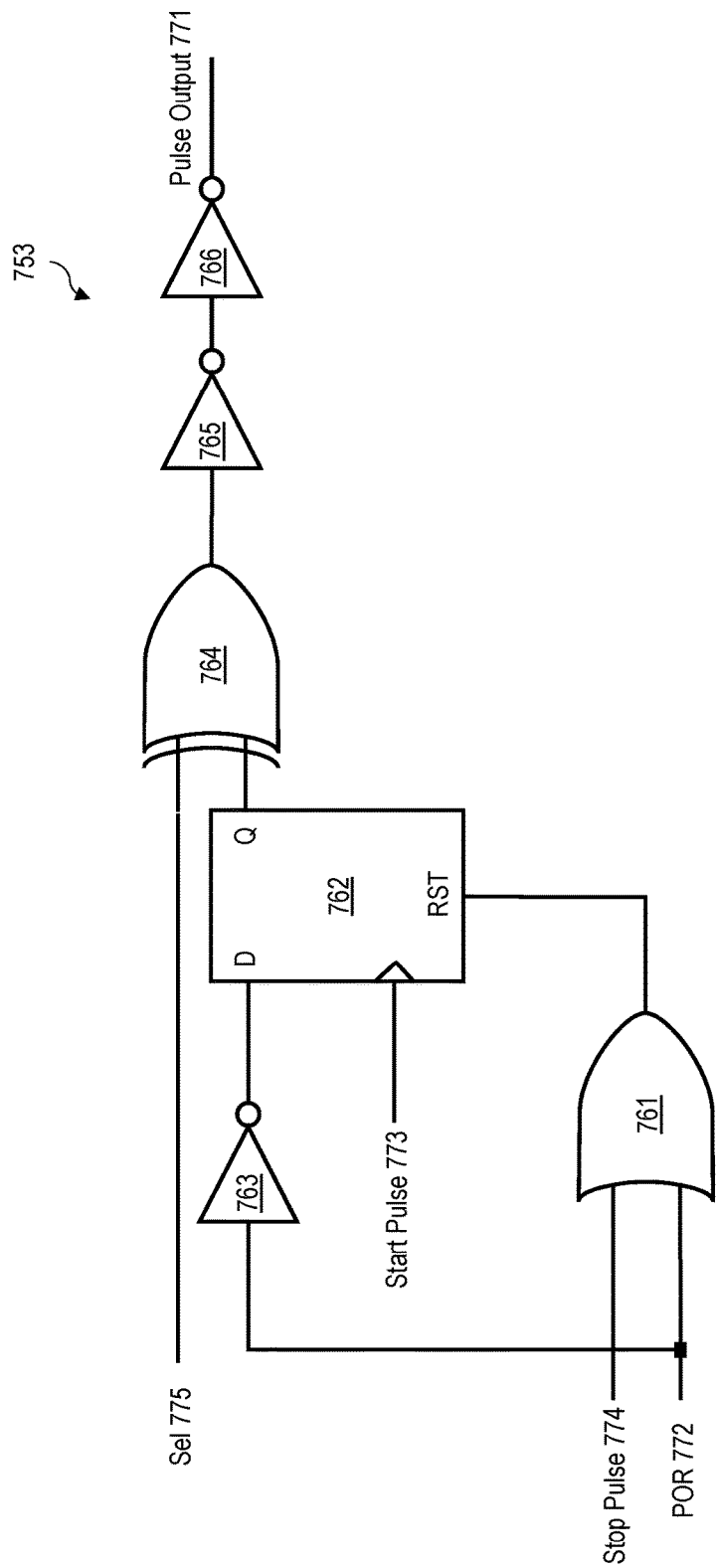
FIG. 7B shows a circuit diagram of an example pulse generator, according to one embodiment.

FIG. 7B shows a circuit diagram of an example pulse generator, according to one embodiment. In one embodiment, the pulse generator 753 includes an OR logic 761, a register (or a flip flop) 762, inverted buffers 763, 765, and 766, and an XOR logic 764. The OR logic 761 receives a power-on-reset (POR) signal 772 and a stop pulse 774 to reset the register 762 on the reset pin RST. The register 762 receives a start pulse 773 as a clock signal and generates a pulse output. For example, the start pulse 773 is generated using a system block and the TrigIn[x] shown in FIG. 7A, and the stop pulse 774 is generated when the counter reaches to zero. The pulse output from the register 762 is XOR'ed with a selection signal 775 using the XOR logic 764. The optional inverted buffers 765 and 766 passes the pulse output from the register 762 to improve the signal integrity of a pulse output 771. The pulse output 771 drives the trigger out signal TrigOut[x]. In an alternative embodiment, the pulse generator 753 may be implemented using a simple RS latch.

Figure 8:
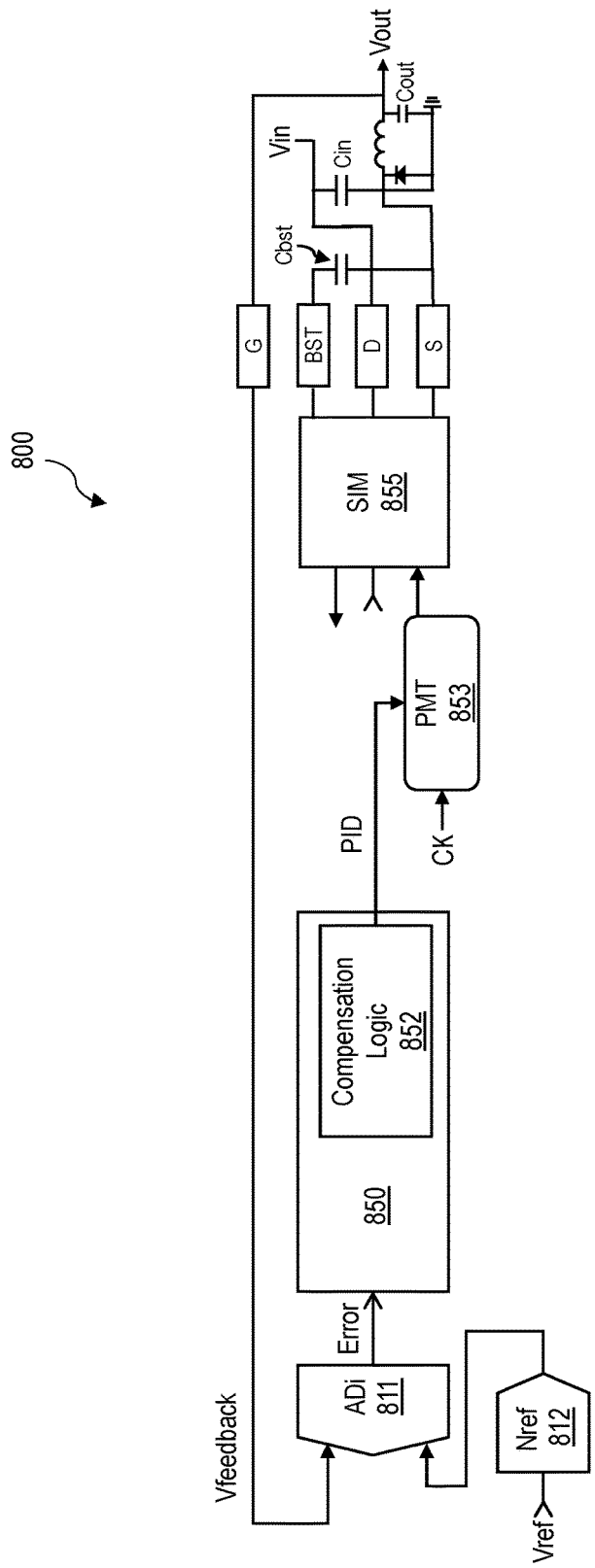
FIG. 8 shows a simplified circuit diagram of a voltage-mode regulator, according to one embodiment.

FIG. 8 shows a simplified circuit diagram of a voltage-mode regulator, according to one embodiment. The present example shows an asynchronous buck regulator 800. The asynchronous buck regulator 800 includes an adaptive error digitizer block 811 (herein also referred to as an ADi block), a voltage reference block 812 (herein also referred to as an Nref block), a compensation memory block 850, a precision modulation timer (PMT) block 853, and a high voltage power transistor block 855 (herein also referred to as a SIM block). The feedback voltage Vfeedback is compared against a reference voltage Vref supplied by the Nref block 812 of the PLD using the ADi block 811. The ADi block 811 produces a digital error that is fed to the compensation memory 850 including an integrated compensation logic 852. The calculated PID value (a sum of the three products E[n]*a, E[n−1]*b, and E[n−2]*c) controls the PMT 853 by setting the PWM pulse width of a duty cycle. The PMT 853 can control a duty cycle of a pulse-width signal that drives the switch of the SIM block 855, turning it on or off as required to maintain the output voltage Vout at a constant voltage level.

In the example shown in FIG. 8, the PMT block 853 is configured as a dynamic timer to drive the high voltage power transistor block 855. The PID signal that is output from the compensation memory block 850 may be used to select a dynamic mode using the mode selector (e.g., mode selector 661 of FIG. 6) of the PMT block 853. Referring to FIG. 6, the PID signal may include a delay of the PWM signal, and the delay is provided by the precision delay block 662. In a static mode, a turn-on time and a turn-off time of a buck regulator (e.g., the hysteretic buck regulator 300 of FIG. 3A) and fixed delays of the turn-on time and the turn-off time are fed to the mode selector 661 to select the static mode. The pulse generator 653 provides an output signal at the expiration of the counters that are with static delays.

A timer block includes: a digital control block including a mode selector and a register loading a time delay; a counter coupled to the register of the digital control block, wherein the counter loads a counter value corresponding to the time delay based on an operational mode selected by the mode selector and generates a digital output indicating the counter value that is decremented at each clock; and a pulse generator configured to generate a pulse signal based on the counter value of the counter. The timer block is integrated in a programmable logic device (PLD) including a programmable fabric and a signal wrapper that is configured to provide signals between the timer block and the programmable fabric. The operational mode of the timer block is programmably configured using the programmable fabric and the signal wrapper.

The time delay may be a programmable time delay or a preset time delay.

The programmable time delay may be received from the programmable fabric, and the programmable time delay may be fed to the one or more registers via the signal wrapper.

The time block may further include a data selector that is configured to select the programmable time delay or the preset time delay based on the operational mode.

The timer block may further include a plurality of registers and a plurality of counters coupled to each of the plurality of registers.

Each of the plurality of counters may be divided into an extendable bits and non-extendable bits.

The extendable bits of the plurality of counters may be coupled to each other to extend the time delay.

The pulse signal may be used to generate a PWM signal to drive a switch of a high voltage transistor block integrated in the PLD.

The pulse signal may be fed to the switch of the high voltage power transistor via a digital fabric of the programmable fabric.

The PLD may be configured as a regulator by configuring the high voltage power transistor.

The regulator may be one of a buck regulator, a boost regulator, a multiphase buck regulator, a buck-boost regulator, a source side regulator, a drain-side regulator, a push-pull DDR regulator, a load switch, and a battery charger.

According to another embodiment, a programmable logic device (PLD) includes: a timer block; a programmable fabric; and a signal wrapper configured to provide signals between the timer block and the programmable fabric. The timer block includes: a digital control block including a mode selector and a register loading a time delay; a counter coupled to the register of the digital control block, wherein the counter loads a counter value corresponding to the time delay based on an operational mode selected by the mode selector and generates a digital output indicating the counter value that is decremented at each clock; and a pulse generator configured to generate a pulse signal based on the counter value of the counter. The operational mode of the timer block is programmably configured using the programmable fabric and the signal wrapper.

The PLD may further include a high voltage transistor block, and the pulse signal may be used to generate a PWM signal to drive a switch of the high voltage transistor block.

The pulse signal may be fed to the switch of the high voltage power transistor via a digital fabric of the programmable fabric.

The PLD may be configured as a regulator by configuring the high voltage power transistor.

The regulator may be one of a buck regulator, a boost regulator, a multiphase buck regulator, a buck-boost regulator, a source side regulator, a drain-side regulator, a push-pull DDR regulator, a load switch, and a battery charger.

The above example embodiments have been described hereinabove to illustrate various embodiments of implementing a precision modulation timer integrated in a PLD. Various modifications and departures from the disclosed example embodiments will occur to those having ordinary skill in the art. The subject matter that is intended to be within the scope of the invention is set forth in the following claims.

What is claimed is:

1. A timer block comprising:
   a digital control block including a register loading a time delay;
   a counter coupled to the register of the digital control block, wherein the counter loads a counter value corresponding to the time delay and generates a digital output based on the counter value at each clock cycle; and
   a pulse generator configured to generate a pulse signal based on the digital output of the counter,
   wherein the timer block is integrated in a programmable logic device (PLD) including a programmable fabric and a signal wrapper that is configured to provide signals between the timer block and the programmable fabric, and
   wherein the time delay loaded to the register is programmably using the programmable fabric and the signal wrapper.

2. The timer block of claim 1, further comprising an oscillator configured to generate clock signals to the counter.

3. The timer block of claim 1, wherein the time delay is a programmable time delay or a preset time delay.

4. The timer block of claim 3, wherein the programmable time delay is fed to the one or more registers via the signal wrapper.

5. The timer block of claim 3, further comprising a data selector that is configured to select the programmable time delay or the preset time delay.

6. The timer block of claim 1, further comprising a plurality of registers and a plurality of counters coupled to each of the plurality of registers.

7. The timer block of claim 6, wherein each of the plurality of counters is divided into an extendable bits and non-extendable bits.

8. The timer block of claim 7, wherein the extendable bits of the plurality of counters are coupled to each other to extend the time delay.

9. The timer block of claim 1, wherein the pulse signal is used to generate a PWM signal to drive a switch of a transistor integrated in the PLD.

10. The timer block of claim 9, wherein the pulse signal is fed to the switch of the transistor via a digital fabric of the programmable fabric.

11. The timer block of claim 9, wherein the PLD is configured as a regulator by configuring the transistor.

12. The timer block of claim 11, wherein the regulator is one of a buck regulator, a boost regulator, a multiphase buck regulator, a buck-boost regulator, a source side regulator, a drain-side regulator, a push-pull DDR regulator, a load switch, and a battery charger.

13. A programmable logic device (PLD) comprising:
   a timer block;
   a programmable fabric; and
   a signal wrapper configured to provide signals between the timer block and the programmable fabric,
   wherein the timer block comprising:
   a digital control block including a register loading a time delay;
   a counter coupled to the register of the digital control block, wherein the counter loads a counter value corresponding to the time delay and generates a digital output based on the counter value at each clock; and
   a pulse generator configured to generate a pulse signal based on the digital output of the counter, wherein the time delay loaded to the register is programmably using the programmable fabric and the signal wrapper.

14. The PLD of claim 13, further comprising a transistor, wherein the pulse signal is used to generate a PWM signal to drive a switch of the transistor.

15. The PLD of claim 14, wherein the pulse signal is fed to the switch of the transistor via a digital fabric of the programmable fabric.

16. The PLD of claim 13, wherein the PLD is configured as a regulator by configuring the transistor.

17. The PLD of claim 16, wherein the regulator is one of a buck regulator, a boost regulator, a multiphase buck regulator, a buck-boost regulator, a source side regulator, a drain-side regulator, a push-pull DDR regulator, a load switch, and a battery charger.

18. A method comprising:
   loading a time delay received from a signal wrapper of a programmable logic device (PLD);
   loading a counter value corresponding to the time delay in a register;
   generating a digital output based on the counter value at each clock cycle;
   generating a pulse signal based on the digital output; and
   providing the pulse signal to the signal wrapper of the PLD,
   wherein the time delay is programmably via a programmable fabric of the PLD.

19. The method of claim 18, wherein the pulse signal is used to generate a PWM signal to drive a switch of a transistor integrated in the PLD.

20. The method of claim 19, wherein the PLD is configured as a regulator by configuring the transistor.

* * * * *